US007221991B2

(12) United States Patent  
Matsushita et al.

(10) Patent No.: US 7,221,991 B2  
(45) Date of Patent: May 22, 2007

(54) SYSTEM AND METHOD FOR MONITORING MANUFACTURING APPARATUSES

(75) Inventors: Hiroshi Matsushita, Yokohama (JP); Tomonobu Noda, Yokohama (JP); Kenichi Kadota, Yokohama (JP); Junji Sugamoto, Yokosuka (JP); Yukihiro Ushiku, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 11/068,778

(22) Filed: Mar. 2, 2005

(65) Prior Publication Data

US 2005/0194590 A1    Sep. 8, 2005

(30) Foreign Application Priority Data

Mar. 3, 2004    (JP)    ............................. P2004-059175

(51) Int. Cl.  
*G06F 19/00*    (2006.01)

(52) U.S. Cl. ........................................ 700/110; 700/121

(58) Field of Classification Search ................ 700/121, 700/110, 109; 702/81; 324/500; 257/48; 438/15

See application file for complete search history.

(56) References Cited

U.S. PATENT DOCUMENTS 6,842,866 B2 * 1/2005 Song et al. ..................... 714/37  
7,043,384 B2 * 5/2006 Matsushita et al. ........... 702/81  
2003/0011376 A1 * 1/2003 Matsushita et al. ........... 438/14  
2004/0049722 A1 * 3/2004 Matsushita .................... 714/724

FOREIGN PATENT DOCUMENTS

JP    2002-359266    12/2002

OTHER PUBLICATIONS

H. Matsushita et al., "Highly Sensitive Inspection System for Lithography-Related Faults in Agile-Fab—Detecting Algorithm for Monitoring and Evaluation of Yield Impact," IEEE Transactions on Semiconductor Manufacturing (Nov. 2002), 15:506-512.  
H. Matsushita et al., "New Method of Classification System for Wafer Maps," Proceedings of ISSM (2004), pp. 482-485.

* cited by examiner

*Primary Examiner*—Leo Picard  
*Assistant Examiner*—Steven R. Garland  
(74) *Attorney, Agent, or Firm*—Finnegan, Henderson, Farabow, Garrett & Dunner, L.L.P.

(57) ABSTRACT

A control system for a manufacturing apparatus includes manufacturing information input unit acquiring time series data of apparatus parameters controlling manufacturing apparatuses; failure pattern classification module classifying in-plane distributions of failures of each of the wafers into failure patterns; an index calculation unit configured to statistically process the time series data by algorithms to calculate indices corresponding to the respective algorithms; an index analysis unit providing first and second frequency distributions of the indices categorized with and without the target failure pattern, to implement significance test between the first and second frequency distributions; and an abnormal parameter extraction unit extracting failure cause index of failure pattern by comparing value of the significance test with test reference value.

9 Claims, 16 Drawing Sheets

FIG. 2

| FAILURE PATTERN CLASSIFICATION NUMBER (1) | | FAILURE PATTERN CLASSIFICATION NUMBER (2) | | |
|---|---|---|---|---|
| WAFER TEST RESULT | LOT NUMBER | WAFER TEST RESULT | LOT NUMBER | |
| 90a | #1721 | 90d | #2311 | |
| 90b | #2132 | 90e | #1992 | ------- |
| 90c | #1611 | 90f | #1911 | |

FIG. 3
| INDEXATION ALGORITHM | DETECTABLE ABNORMALITY |
|---|---|
| AUTOCORRELATION FUNCTION | VARIATION FROM STEADY STATE |
| CONCORDANCE RATE OF INCREASE AND DECREASE | VARIATION AS WHOLE APPARATUS |
| PRIMARY FITTING COEFFICIENT | DRIFT VARIATION |
| CORRELATION WITH LAST SEQUENCE WAVEFORM | ACCIDENTAL VARIATION |
| CORRECTION WITH PRIOR SEQUENCE WAVEFORM | ACCIDENTAL VARIATION |
FIG. 4
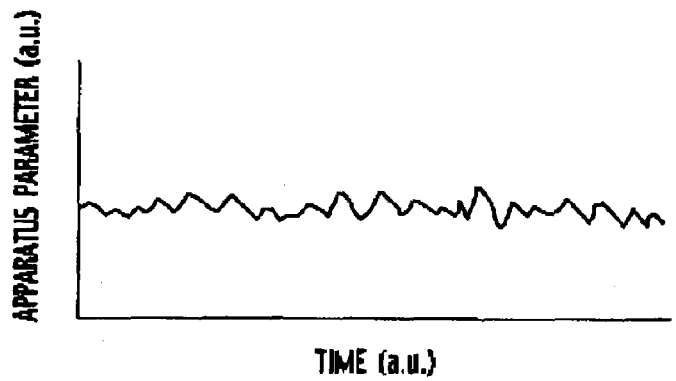
FIG. 5
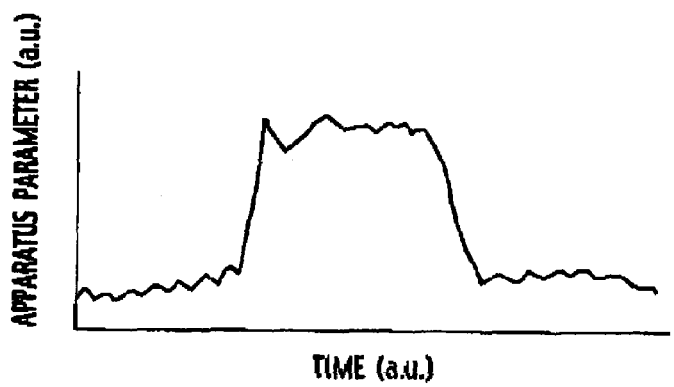

FIG. 16

| LOT NUMBER | APPARATUS PARAMETER WAVEFORM INDEX NUMBER [1] | APPARATUS PARAMETER WAVEFORM INDEX NUMBER [2] | |
|---|---|---|---|
| #1693 | 0.36 | 0.63 | |
| #1721 | 0.92 | 0.72 | |
| #1992 | 0.11 | 0.12 | |
| ⁓ ⋮ | ⁓ ⋮ | ⁓ ⋮ | ⁓ |

| APPARATUS PARAMETER WAVEFORM INDEX NUMBER | FAILURE PATTERN CLASSIFICATION NUMBER | | |
|---|---|---|---|
| | [1] | [2] | [3] |
| [1] | 0.72 | 0.32 | 0.92 |
| [2] | 0.69 | 0.63 | 0.63 |
| [3] | 0.52 | 0.01 | 0.26 |

| FAILURE PATTERN CLASSIFICATION | PROCESS | MANUFACTURING APPARATUS | APPARATUS PARAMETER | INDEX |
|---|---|---|---|---|
| WAFER CENTRE FAILURE | N | M | TEMPERATURE | AUTOCORRELATION COEFFICIENT |
| ⁝ | ⁝ | ⁝ | ⁝ | ⁝ |

FIG. 23

| ACTIVE LAYER PROCESS MODULE | APPARATUS PARAMETER NUMBER [1] | APPARATUS PARAMETER NUMBER [2] | APPARATUS PARAMETER NUMBER [3] | | |
|---|---|---|---|---|---|
| LOT NUMBER #1672 | 0.76 | 3.65 | 9.36 | | |
| #2112 | 1.27 | 1.21 | 27.2 | | |
| #1936 | 12.5 | 0.01 | 11.5 | | |
| ⋮ | | | | | |

FIG. 24

| TARGET PROCESS MODULE / LOT NUMBER | ACTIVE LAYER PROCESS MODULE | GATE PROCESS MODULE | FIRST LAYER WIRING PROCESS MODULE | | |
|---|---|---|---|---|---|
| #1672 | 98.6 | 91.5 | 93.5 | | |
| #2112 | 92.5 | 88.2 | 99.2 | | |
| #1936 | 88.2 | 93.6 | 88.2 | | |
| ⋮ | | | | | |

FIG. 25

| ACTIVE LAYER PROCESS MODULE | | GATE PROCESS MODULE | | FIRST LAYER WIRING PROCESS MODULE | | | |
|---|---|---|---|---|---|---|---|
| APPARATUS PARAMETER NUMBER | APPARATUS PARAMETER SET VALUE | APPARATUS PARAMETER NUMBER | APPARATUS PARAMETER SET VALUE | APPARATUS PARAMETER NUMBER | APPARATUS PARAMETER SET VALUE | | |
| (17) | 39.6 | (96) | 13.2 | (136) | 43.6 | | |
| (365) | 1.23 | (192) | 7.6 | (721) | 3.8 | | |
| (1721) | 75.6 | (376) | 161.8 | (1721) | 7.2 | | |
| (2936) | 3.5 | | | (2236) | 112.8 | | |
| | | | | (5192) | 92.0 | | |
| | | | | | | | |

SYSTEM AND METHOD FOR MONITORING MANUFACTURING APPARATUSES

CROSS REFERENCE TO RELATED APPLICATIONS AND INCORPORATION BY REFERENCE

This application is based upon and claims the benefit of priority from prior Japanese Patent Application P2004-059175 stored on Mar. 3, 2004; the entire contents of which are incorporated by reference herein.

BACKGROUND OF THE INVENTION

1. Field of the Invention

The present invention relates to detection of abnormal operation of manufacturing apparatuses used in manufacturing processes of semiconductor integrated circuits. In particular, the invention relates to a control system for a group of manufacturing apparatuses and a method for controlling the manufacturing apparatuses. The control system identifies a reason for a failure and achieves an optimal operation of the manufacturing apparatus.

2. Description of the Related Art

One of the most important problems in the production of a semiconductor device such as a large-scale integrated circuit (LSI) is to improve the yield rate. Improving the yield rate increases productivity. In order to improve the yield rate, it is important to analyze a yield loss and thus, analyze a manufacturing process, a manufacturing apparatus or a design condition so as to determine the cause of the yield loss. Then, remedial measures can be taken to avoid or prevent yield loss. However, the LSI is produced, for example, by a sequence of several hundred processes and manufacturing apparatuses. Accordingly, once a failure occurs in the LSI, it is generally very difficult to detect a reason for the failure.

Test results of electrical characteristics of a wafer, conducted after completion of a wafer process in the LSI production, sometimes give an important clue for identifying the reason for the failure. This is because the wafer tests are performed on a wafer after completion of the production process. The results of the wafer test are mapped and displayed with respect to positions on a wafer surface, and failure positions on the wafer surface are detected. A representative example of such a map is a fail bit map (FSM) acquired in a memory product. In a logic product, a merged memory logic product and the like, a pass/fail map is acquired by the test where a nondefective chip (pass) or a defective chip (fail) are mapped and displayed.

A failure distribution on the wafer surface may be classified into two types in broad terms, i.e., a random failure in which failures are evenly distributed regardless of positions on the wafer surface; and a clustering failure in which the failures disproportionately occur in a portion of the wafer surface. In many cases, the clustering failure is caused by a systematic factor attributable to the manufacturing process, the manufacturing apparatus and the like. The clustering failure is a major reason for a decrease in the yield rate. The failure attributable to the manufacturing process, manufacturing apparatus and the like generates a failure pattern on the wafer surface inherent in the manufacturing process and the manufacturing apparatus. Hence, a pattern analysis of the clustering failure is a clue for identifying the reason for the occurrence of the failure.

Detection of the reason for a failure in the production of an electronic device such as the LSI is implemented by tracing back into the manufacturing record of the LSI for wafers or manufacturing lots in which the same clustering failure has occurred. For example, a search is made as to whether or not there is a commonly used manufacturing apparatus for processed wafers on which the same clustering failures have occurred in the same manufacturing process. For detecting the reason for a failure, there has been proposed a method of implementing a significance test for the manufacturing apparatuses regarding characteristic quantities obtained by quantifying the clustering failures (refer to Japanese Patent Laid-Open No. 2002-359266).

A manufacturing apparatus includes a unit which collects and records operation requirement information such as conditions and set values of the manufacturing apparatus during processing of wafers. The operation requirement information of the manufacturing apparatus is referred to as an apparatus parameter. Detail analysis of apparatus parameters enables identification of a name of a manufacturing apparatus in which a failure occurs, as well as an abnormal operation portion of the manufacturing apparatus. Therefore, measures to prevent the occurrence of the failure may be provided at an early stage. Even statistical tests, by use of apparatus parameters themselves, however, sometimes have a problem that does not lead to the identification of a cause of the abnormality. Also, beginning a search for a cause of a failure, after detecting the failure from wafer test results, creates a problem in some cases in that the feed back to the manufacturing process is too late. In addition, extraction and the maintenance of operation requirements of a manufacturing apparatus for manufacturing products at a high yield are extremely difficult because the number of apparatus parameters is huge and the apparatus parameters are correlated with each other.

SUMMARY OF THE INVENTION

A first aspect of the present invention inheres in a control system for manufacturing apparatuses, including: a manufacturing information input unit configured to acquire time series data of apparatus parameters controlling a plurality of manufacturing apparatuses, the manufacturing apparatuses performing a sequence of manufacturing processes on wafers so as to manufacture semiconductor devices; a failure pattern classification module configured to classify in-plane distributions of failures in each of the wafers into failure patterns; an index calculation unit configured to statistically process the time series data by a plurality of algorithms so as to calculate a plurality of indices corresponding to the respective algorithms; an index analysis unit configured to provide first and second frequency distributions of the indices so as to implement a significance test between the first and second frequency distributions, the first and second frequency distributions categorized with and without the target failure pattern respectively; and an abnormal parameter extraction unit configured to extract a failure cause index of the target failure pattern by comparing a value of the significance test with a test reference value.

A second aspect of the present invention inheres in a control system for manufacturing apparatuses, including: a manufacturing information input unit configured to acquire set values of apparatus parameters controlling a plurality of manufacturing apparatuses in a plurality of process modules; an inspection information input unit configured to acquire wafer test information and defect information from an electrical test and a defect inspection of wafers processed in the process nodules; a yield calculation unit configured to calculate process yields of the process modules based on the wafer test information and the defect information; and an optimum parameter extraction unit configured to statistically extract a target apparatus parameter having a significant difference for the process yield, so as to determine an optimum set value of the target apparatus parameter, based on the set values and the process yield, the optimum set value providing the maximum process yield.

A third aspect of the present invention inheres in a method for controlling manufacturing apparatuses, including: acquiring time series data of apparatus parameters controlling a plurality of manufacturing apparatuses; classifying in-plane distributions of failures of wafers into failure patterns, the wafers processed by the manufacturing apparatuses; statistically processing the time series data by a plurality of algorithms so as to calculate a plurality of indices corresponding to the respective algorithms; providing first and second frequency distributions of the indices so as to implement a significance test between the first and second frequency distributions, the first and second frequency distributions categorized with and without the target failure pattern respectively; and identifying a failure cause index of the target failure pattern by comparing a value of the significance test with a test reference value.

A fourth aspect of the present invention inheres in a method for controlling manufacturing apparatuses, including: acquiring set values of apparatus parameters controlling a plurality of manufacturing apparatuses in a plurality of process modules; acquiring wafer test information and defect information measured by an electrical test and a defect inspection of wafers processed by the process modules; calculating process yields of the process modules based on the wafer test information and the defect information; and statistically extracting a target apparatus parameter having a significant difference for the process yield, so as to determine an optimum set value of the target apparatus parameter, based on the set values and the process yield, the optimum set value providing the maximum process yield.

BRIEF DESCRIPTION OF THE DRAWINGS

FIG. 2 is a diagram showing an example of a wafer test result for use in explaining the first embodiment of the present invention.

FIG. 3 is a table showing an example of indexation algorithms of apparatus parameter waveform for use in explaining the first embodiment of the present invention.

FIG. 4 is a diagram showing an example of an apparatus parameter waveform for use in explaining indexation by autocorrelation function.

FIG. 5 is a diagram showing another example of an apparatus parameter waveform for use in explaining indexation by autocorrelation function.

FIG. 16 is a table showing an example of apparatus parameter waveform indices for use in explaining the first embodiment of the present invention.

FIG. 23 is a table showing an example of apparatus parameters of all manufacturing apparatuses in a target process module for use in explaining the second embodiment of the present invention.

FIG. 24 is a table showing an example of a yield of each target process module for use in explaining the second embodiment of the present invention.

FIG. 25 is a table showing an example of an extraction result of optimum apparatus parameter set values which provide a high yield in each target process module for use in explaining the second embodiment of the present invention.

DETAILED DESCRIPTION OF THE INVENTION

Figure 1:
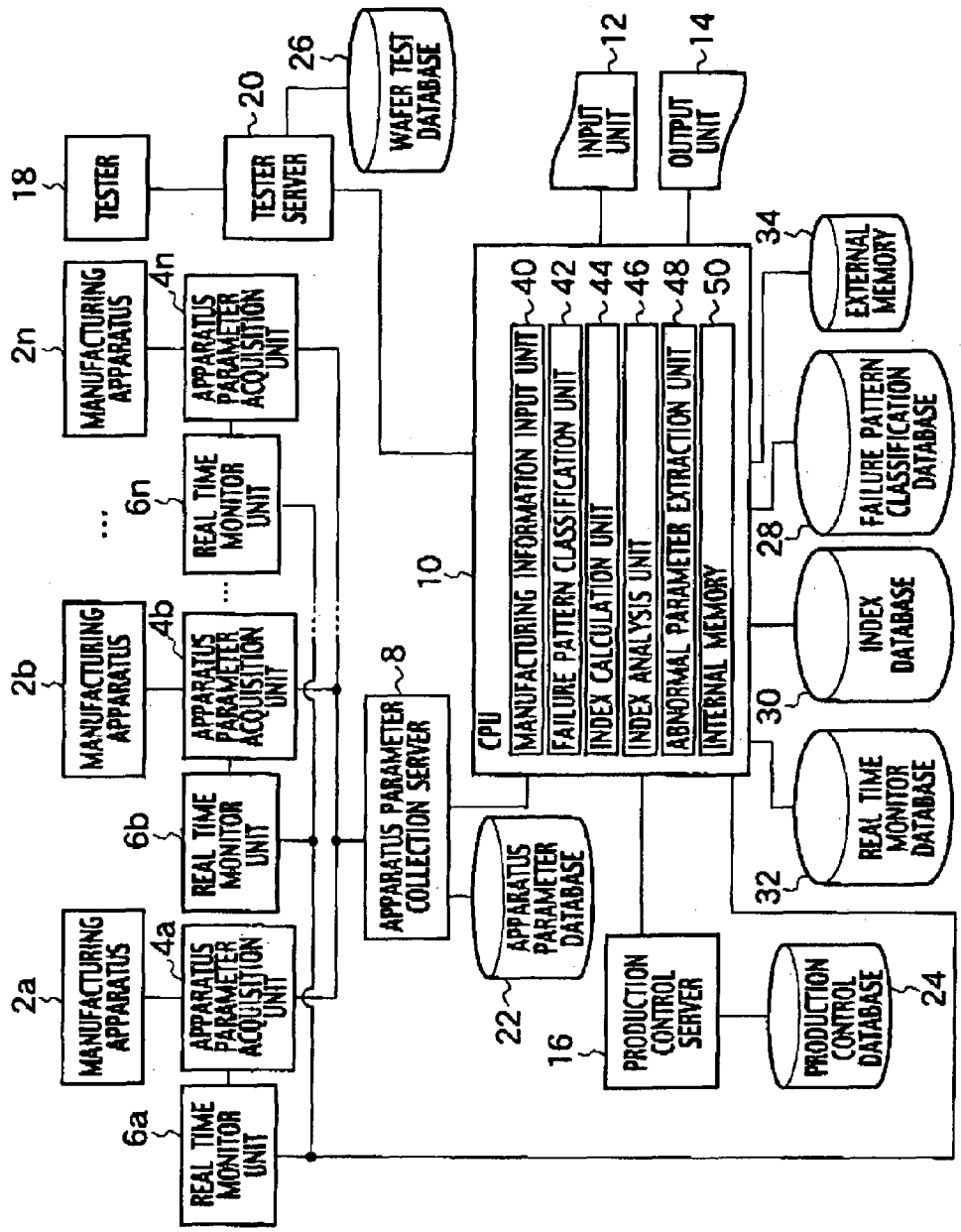
FIG. 1 is a block diagram showing an example of a configuration of a control system of manufacturing apparatuses according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

A control system of a group of manufacturing apparatuses according to a first embodiment of the present invention includes an apparatus parameter database 22, a production control database 24, a wafer test database 26, a failure pattern classification database 28, an index database 30, a real time monitor database 32, a plurality of real time monitor units 6a, 6b, . . . , 6n, a central processing unit (CPU) 10, and the like, as shown in FIG. 1. The apparatus parameter database 22 is installed in an apparatus parameter collection server 8. The production control database 24 is installed in a production control server 16. The wafer test database 26 is installed in a tester server 20. The real time monitor units 6a, 6b, . . . , 6n, the apparatus parameter collection server 8, and the tester server 20 are connected to the CPU 10. Also, the wafer test database 26, an input unit 12, an output unit 14, the failure pattern classification database 28, the index database 30, the real time monitor database 32, and an external memory 34 are connected to the CPU 10. Furthermore, the CPU 10 includes a manufacturing information input unit 40, a failure pattern classification unit 42, an index calculation unit 44, an index analysis unit 46, an abnormal parameter extraction unit 48, an internal memory 50, and the like.

Apparatus parameter acquisition units 4a, 4b, . . . , 4n which are respectively attached to a plurality of manufacturing apparatuses 2a, 2b, . . . , 2n disposed in manufacturing facilities for a semiconductor device are connected to the apparatus parameter collection server 8. The real time monitor units 6a, 6b, . . . , 6n are connected to the apparatus parameter acquisition units 4a, 4b, . . . , 4n, respectively. A tester 18 is connected to the tester server 20.

The input unit 12 refers to devices such as a keyboard and a mouse. When an input operation is performed from the input unit 12, corresponding key information is transmitted to the CPU 10. The output unit 14 refers to a screen such as a monitor, such as a liquid crystal display (LCD), a light emitting diode (LED) panel, an electroluminescent (EL) panel and the like. The output unit 14 is controlled by the CPU 10. The output unit 14 displays a failure map obtained from an electrical test, a calculation result of an index obtained by quantifying an apparatus parameter, and the like. The external memory 34 stores a program for allowing the CPU 10 to implement classification of a failure pattern, indexation of an apparatus parameter, a statistical calculation of an index analysis and the like. The internal memory 50 of the CPU 10 or the external memory 34 temporarily stores data obtained during a calculation and an analysis thereof during the operation of the CPU 10.

Apparatus parameters such as manufacturing conditions and set values of the manufacturing apparatuses 2a, 2b, . . . , 2n are transmitted from the manufacturing apparatuses 2a, 2b, . . . , 2n. The apparatus parameters include, for example, information such as set values described in a recipe and monitor values of sensor outputs, such as pressure, gas flow rate, temperature, and applied radio frequency (RF) power, and the like, of the operating conditions in a process chamber. The apparatus parameter acquisition units 4a, 4b, . . . , 4n provided to the respective manufacturing apparatuses 2a, 2b, . . . , 2n acquire time series data of apparatus parameters of the respective manufacturing apparatuses 2a, 2b, . . . , 2n. The apparatus parameter acquisition units 4a, 4b, . . . , 4n transmit the time series data of apparatus parameters as apparatus parameter information, for example, to a network system such as a local area network (LAN) provided in a clean room. The apparatus parameter collection server 8 collects and stores the apparatus parameter information as time series data, which is transmitted from the apparatus parameter acquisition units 4a, 4b, . . . , 4n in the apparatus parameter database 22. The production control server 16 stores product names and lot numbers of products which are processed in the respective manufacturing apparatuses 2a, 2b, . . . , 2n, together with time information in the production control database 24. The tester 18 executes a wafer test so as to measure failures for a plurality of circuit blocks fabricated on a wafer of semiconductor devices for which the wafer process has been completed. The wafer test includes a variety of electrical tests executed in the manufacturing facilities. The test server 20 which controls the tester 18 generates a failure map displaying an in-plane distribution of a failed semiconductor device in accordance with results of the wafer test and stores the failure map together with the lot number in the wafer test database 26.

The manufacturing information input unit 40 of the CPU 10 acquires the time series data of the apparatus parameters for the respective manufacturing apparatuses 2a, 2b, . . . , 2n from the apparatus parameter collection server 8. Moreover, the manufacturing information input unit 40 acquires processing record information for each lot from the production control server 16. As a result, time series data of each apparatus parameter of the manufacturing apparatuses 2a, 2b, . . . , 2n, to which processing record information of a lot is added, are provided.

The failure pattern classification module 42 refers to failure maps from tester server 20 and classifies lots having failure maps 90a, 90b, 90c, . . . , 90d, 90e, 90f, . . . , into each failure pattern, based on a tendency of the in-plane distribution on a wafer of clustering failures 92 of failed semiconductor devices, which are indicated by black dots, as shown in FIG. 2. For instance, lots having the clustering failures 92 on a left lower portion in a wafer surface are classified by a failure pattern classification number [1]. Also, lots having the clustering failure 92 on a central portion in a wafer surface are classified in a failure pattern classification number [2]. The classification results of failure patterns are stored together with lot numbers in the failure pattern classification database 28. The classification of failure patterns is performed on lots on which the wafer test has been conducted during a certain period in the past. In the first embodiment, the failure pattern classification module 42 classifies, for example, the wafer test results for one week in the past and updates the wafer test results day after day. Failure patterns are classified by comparison of a threshold with a failure pattern index provided by quantification of a failure pattern of a clustering failure. For instance, a wafer plane is divided to define subareas on the wafer plane. A failure density of clustering failures in a target subarea is evaluated as a failure pattern index. Alternatively, the extent of failure deviation in the target subarea may be statistically processed to quantify as a failure pattern index.

The index calculation unit 44 implements indexation of time series data of the apparatus parameters. The term "indexation" means that a waveform of time series data of apparatus parameter values for a specified period of time (hereinafter, referred to as an "apparatus parameter waveform") is expressed in terms of a scalar value (index). In the first embodiment, an apparatus parameter waveform during a lot sequence period for each lot between loading in a manufacturing apparatus and unloading from a manufacturing apparatus after completion of processing, is indexed with reference to the lot processing record information.

As shown in FIG. 3, for indexation of an apparatus parameter waveform, a plurality of algorithms are used. An abnormality that is capable of being detected by each indexation algorithm of an apparatus parameter waveform is different depending on each indexation algorithm.

In an example of the indexation algorithm, an autocorrelation function is used. Regularity of an apparatus parameter waveform in a lot sequence period between loading and unloading of a lot is indexed as an autocorrelation coefficient. As shown in FIG. 4, when an apparatus parameter provides a steady-state value for the time, the autocorrelation coefficient that is an apparatus parameter waveform index is small. On the other hand, as shown in FIG. 5, when an apparatus parameter varies for the time, an apparatus parameter index increases depending on the degree of variation of the apparatus parameter value. Accordingly, the autocorrelation efficiency of an apparatus parameter waveform is effective as an index for detecting an apparatus parameter that varies from a steady state during the occurrence of an abnormality in a manufacturing apparatus.

Figure 6:
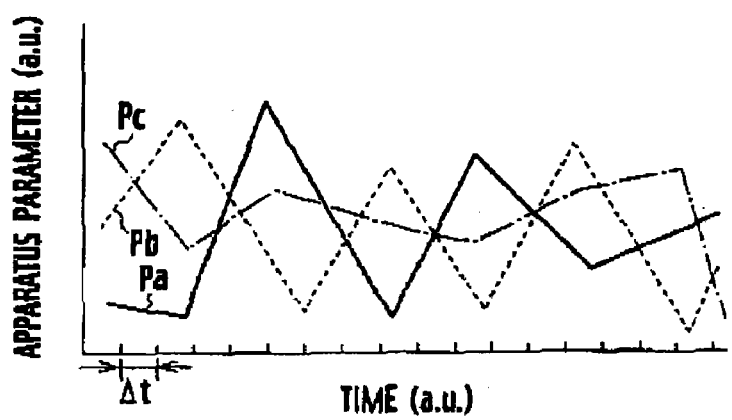
FIG. 6 is a diagram showing an example of apparatus parameter waveforms for use in explaining indexation by concordance rate of increase and decrease.
Figure 7:
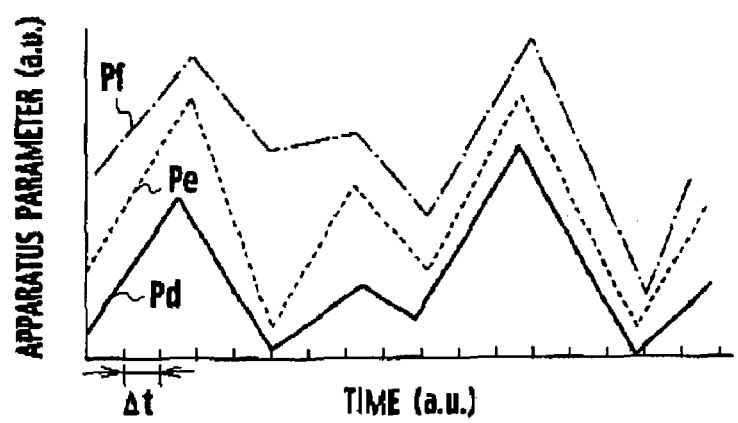
FIG. 7 is a diagram showing another example of apparatus parameter waveforms for use in explaining indexation by concordance rate of increase and decrease.

In another example of the indexation algorithm, a concordance raze of increase and decrease tendency in variations of apparatus parameter waveforms is calculated as an apparatus parameter waveform index, for a plurality of apparatus parameters obtained from one manufacturing apparatus. For instance, a lot sequence is divided by a constant time interval $\Delta t$. For increase and decrease tendency of each of a plurality of apparatus parameter values within the time interval $\Delta t$, a tendency value of "0" is provided when the increase and decrease tendency does not correspond with each other and a tendency value of "1" is provided when the increase and decrease tendency corresponds with each other. A sum of the tendency values in the entire time band of the lot sequence is indexed as a concordance rate. As shown in FIG. 6, for example, when the increase and decrease tendencies of the apparatus parameters Pa, Pb and Pc have no relation with each other, the concordance rate is low. Thus, the apparatus parameter waveform index is small. On the other hand, as shown in FIG. 7, when the increase and decrease tendencies of the apparatus parameters Pd, Pe and Pf are affected by conditions of the manufacturing apparatus so as to change in a similar manner, the concordance rate is high. Thus, the apparatus parameter waveform index is large. Hence, the concordance rate of the increase and decrease tendencies of a plurality of apparatus parameter waveforms is an index that is effective for detecting an abnormality of a manufacturing apparatus where a plurality of apparatus parameters change with the same tendency.

Figure 8:
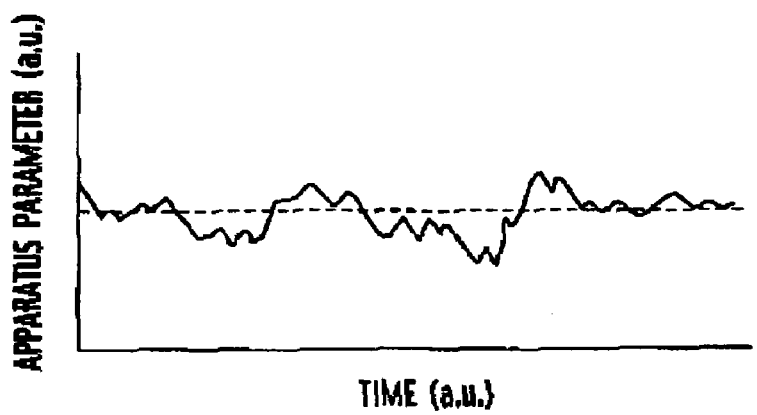
FIG. 8 is a diagram showing an example of an apparatus parameter waveform for use in explaining indexation by primary fitting coefficient.
Figure 9:
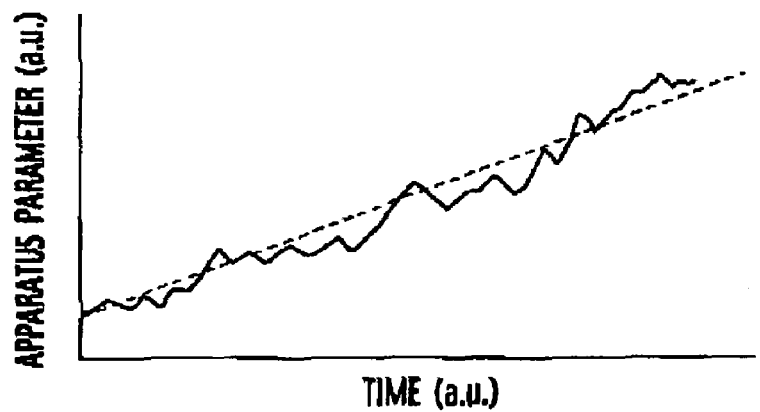
FIG. 9 is a diagram showing another example of an apparatus parameter waveform for use in explaining indexation by primary fitting coefficient.

In yet another example of the indexation algorithm, a primary fitting coefficient that is a gradient when a time series variation of an apparatus parameter waveform is approximated by a linear function is calculated as an apparatus parameter waveform index. As shown in FIG. 8, when apparatus parameter values vary around a constant value represented by the dotted line, the apparatus parameter waveform index is small. On the other hand, as shown in FIG. 9, when the time series variation of apparatus parameter values linearly increases, the apparatus parameter waveform index is large. Thus, the primary fitting coefficient is an effective index for detecting an abnormality showing a drift variation of a manufacturing apparatus.

Figure 10:
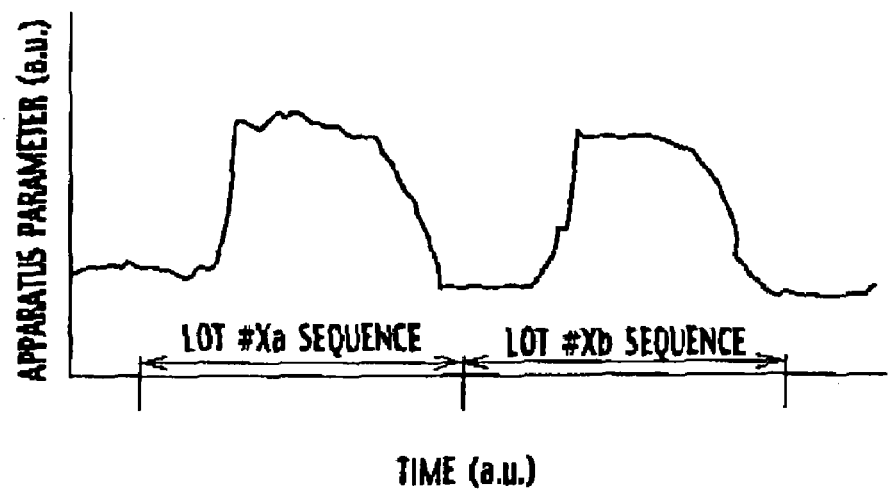
FIG. 10 is a diagram showing an example of an apparatus parameter waveform for use in explaining indexation by correlation with an apparatus parameter waveform of a last lot sequence.
Figure 11:
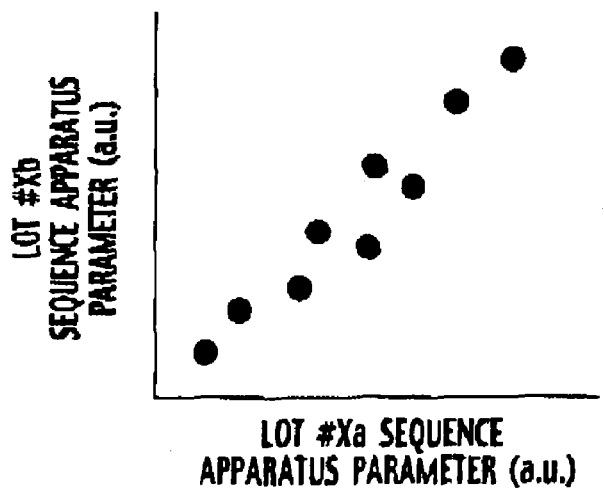
FIG. 11 is a diagram showing an example of correlation between apparatus parameter waveforms of a target lot sequence and a last lot sequence.
Figure 12:
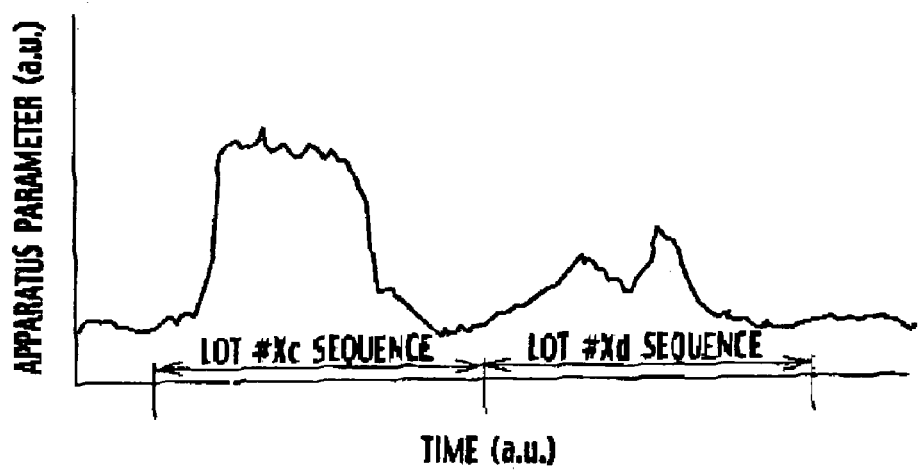
FIG. 12 is a diagram showing another example of an apparatus parameter waveform for use in explaining indexation by correlation with an apparatus parameter waveform of a last lot sequence.
Figure 13:
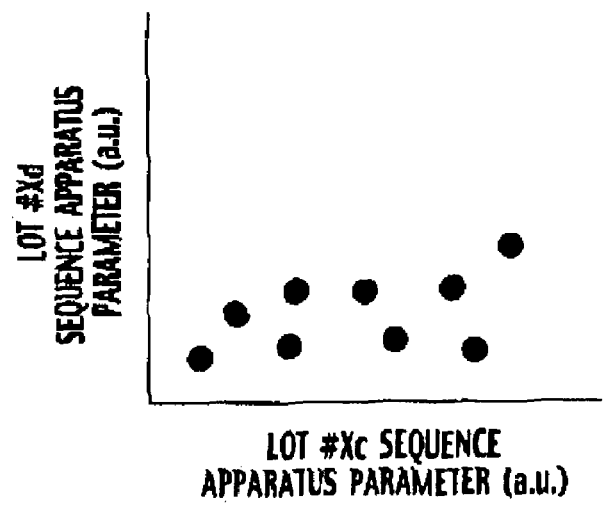
FIG. 13 is a diagram showing another example of correlation between apparatus parameter waveforms of a target lot sequence and a last lot sequence.

In yet another example of the indexation algorithm, a value relating to a correlation coefficient of a correlation indicating a difference of apparatus parameter waveforms during a target lot sequence and a last lot sequence is calculated as an apparatus parameter waveform index. Specifically, for the correlation coefficient r when the apparatus parameters of corresponding times in the target and last lot sequences are two-dimensionally plotted, a value of $(1-r)$ is provided as an apparatus parameter waveform index. As shown in FIG. 10, when apparatus parameter waveforms of lot #Xa and lot #Xb sequentially processed in a manufacturing apparatus of interest are similar to each other, the correlation coefficient r of the two-dimensional plot of the last lot #Xa and the target lot #Xb is about one, as shown in FIG. 11. Thus, the apparatus parameter waveform index is about 0. On the other hand, as shown in FIG. 12, when apparatus parameter waveforms of lot #Xc and lot #Xd sequentially processed in a manufacturing apparatus of interest are different from each other, the correlation coefficient r of the two-dimensional plot of the last lot #Xc and the target lot #Xd is close to 0, as shown in FIG. 13. Thus, the apparatus parameter waveform index is a value close to one. Therefore, an apparatus parameter waveform index evaluated from the correlation coefficient r of target and last lot sequences is effective for detecting an apparatus parameter waveform change due to accidental abnormality occurrence.

Figure 14:
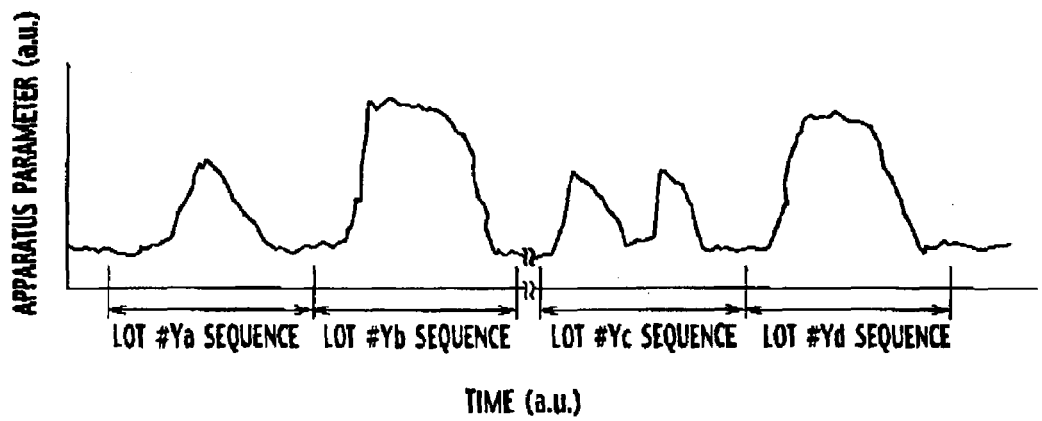
FIG. 14 is a diagram showing an example of an apparatus parameter waveform for use in explaining indexation by correlation with an apparatus parameter waveform of a prior lot sequence.
Figure 15:
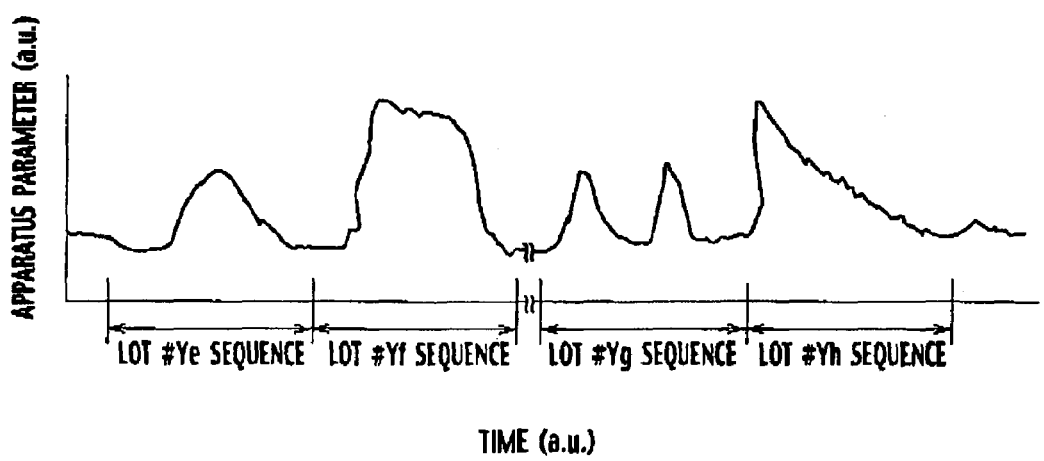
FIG. 15 is a diagram showing another example of an apparatus parameter waveform for use in explaining indexation by correlation with an apparatus parameter waveform of a prior lot sequence.

Moreover, in still another example of the indexation algorithm, a value relating to the correlation coefficient of a correlation indicating resemblance of apparatus parameter waveforms between a target lot sequence and a prior lot sequence is calculated as an apparatus parameter waveform index. Specifically, in the same algorithm as shown in FIGS. 10 to 13, the correlation coefficient r of a two-dimensional plot of a target lot sequence and a prior lot sequence is evaluated. The largest value of the correlation coefficient rmax is searched to provide a value of $(1-rmax)$ as an apparatus parameter waveform index. As shown in FIG. 14, among apparatus parameter waveforms of lot #Ya, #Yb, . . . , #Yc and #Yd sequentially processed in a manufacturing apparatus of interest, the target lot #Yd sequence and the prior lot #Yb sequence exhibit almost the same waveform, providing the maximum correlation coefficient rmax. Accordingly, the apparatus parameter waveform index $(1-rmax)$ of the target lot #Yd sequence and the prior lot #Yb sequence is a value close to zero. On the other hand, as shown in FIG. 15, among apparatus parameter waveforms of lot #Ye, #Yf, . . . , Yg and *Yh sequentially processed in a manufacturing apparatus of interest, the target lot #Yh sequence and the prior lot #Ye sequence that provide the largest correlation coefficient rmax are not similar. Thus, the apparatus parameter waveform index $(1-rmax)$ of the target lot #Yh sequence and the prior lot #Ye sequence is a value close to one. Accordingly, the apparatus parameter waveform index evaluated from the largest correlation coefficient rmax between target and prior lot sequences is effective for detecting an abnormal apparatus parameter waveform when apparatus parameter waveforms are different depending on process recipes.

The index calculation unit 44 stores the respective apparatus parameter waveform indices evaluated by all the algorithms shown in FIG. 3, to the index database 30 together with lot numbers, for all lots processed in all the manufacturing apparatuses 2a, 2b, . . . , 2n.

The index analysis unit 46 categorizes the i-th apparatus parameter waveform index of each lot with and without the j-th failure pattern in reference to the index database 30 and the failure pattern classification database 28, to provide frequency distributions. A significance test value Pij is evaluated by the chi square ($\chi^2$) test between the frequency distributions categorized with and without the failure pattern of classification number [j]. When the significance test value Pij is equal to or less than the test reference value, the presence of a significant difference is determined. Here, the test reference value of the significance test value Pij is set to 0.05.

Figure 17:
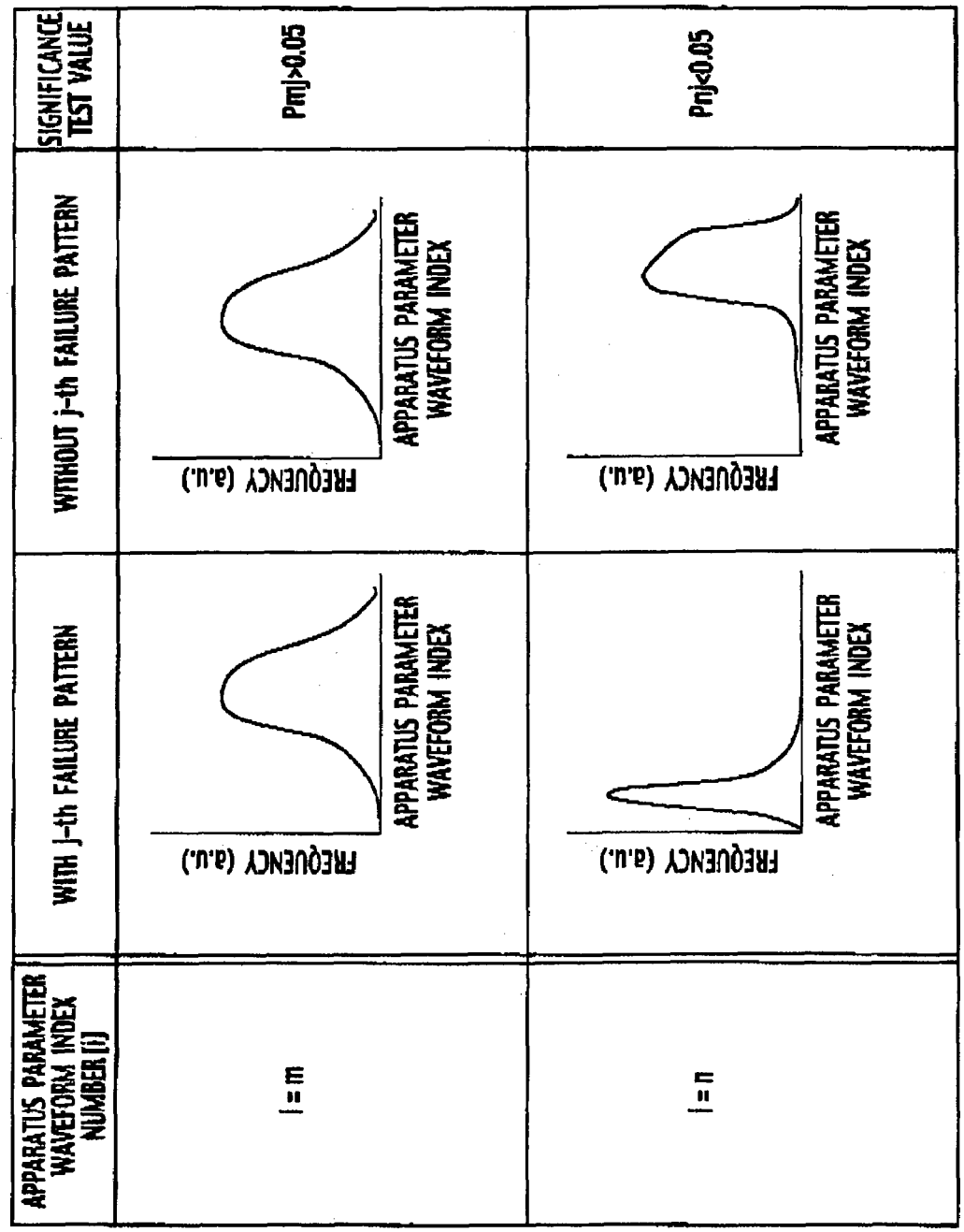
FIG. 17 is a table showing an example of a significance test of apparatus parameter waveform indices for use in explaining the first embodiment of the present invention.

For instance, as shown in FIG. 17, frequency distributions of the m-th apparatus waveform index are similar with or without the failure pattern of classification number [j]. The significance test value Pij for the frequency distribution of the m-th apparatus parameter waveform index is larger than the test reference value. Thus, it is determined that there is not a significant difference. Accordingly, the apparatus parameter corresponding to the apparatus parameter waveform index number [m] is determined not to be a cause for the failure pattern of classification number [j]. Also, frequency distributions of the n-th apparatus parameter waveform index are different with or without the failure pattern of classification number [j]. The significance test value Pnj for the frequency distribution of the n-th apparatus parameter waveform index is less than the test reference value. Thus, it is determined that there is a significant difference. Accordingly, the apparatus parameter corresponding to the apparatus parameter waveform index number [n] is determined to be a cause of a failure for the failure pattern of classification number [j]. The significance test values Pij for all the apparatus parameter waveform indices and the failure pattern classification are calculated for all the lots during a target period of time, as shown in 18.

Figures 18, 19, 20:
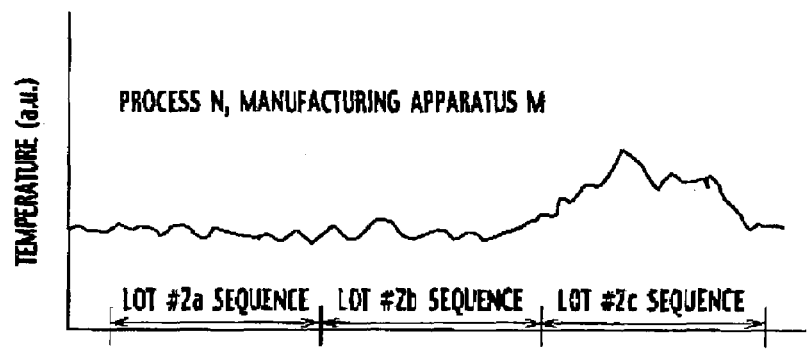
FIG. 18 is a table showing an example of a significance test value of apparatus parameter waveform indices of failure patterns for use in explaining the first embodiment of the present invention.
FIG. 19 is a diagram showing an example of an apparatus parameter waveform of a lot sequence, in which an abnormal variation occurs, for use in explaining the first embodiment of the present invention.
FIG. 20 is a table showing an example of a significance test result for use in explaining the first embodiment of the present invention.

The abnormal parameter extraction unit 48 searches the significance test values Pij that are less than the test reference value, from the table shown in FIG. 18. As shown in FIG. 18, since the significance test value P32 is 0.01, which is less than the test reference value, it is determined that a significant difference is present. As a result, the apparatus parameter waveform index number [3] is extracted as a failure cause index of a wafer center failure of the failure pattern classification number [2] shown in FIG. 2. For example, as shown in FIG. 19, in lot #Za, lot #Zb, and lot #Zc sequentially processed in the manufacturing apparatus M of the process N, an abnormal variation of temperature corresponding to the apparatus parameter waveform index number [3] which corresponds to the occurrence of a wafer center failure can be seen in the lot #Zc sequence. The abnormal variation of temperature in the target lot #Zc sequence is detected with high sensitivity particularly by the apparatus parameter waveform index using the autocorrelation coefficient.

When identifying a target apparatus parameter corresponding to the failure cause index in which abnormality occurs, the abnormal parameter extraction unit 48 stores conditions for abnormality occurrence in the target apparatus parameter and abnormality occurrence information for the target apparatus parameter in the real time monitor database 32. The abnormality occurrence information includes names of a target process, a target manufacturing apparatus, and a target apparatus parameter, an index algorithm that has detected the abnormality, and the like. Additionally, the abnormal parameter extraction unit 48 transmits the abnormality occurrence information to the real time monitor units 6a, 6b, . . . , 6n connected to the apparatus parameter acquisition units 4a, 4b, . . . , 4n. Based on the abnormality occurrence information received from the abnormal parameter extraction unit 48, a target real time monitor unit corresponding to the target manufacturing apparatus continuously monitors a value of a target apparatus parameter waveform index for the target apparatus parameter extracted as a cause of a failure, by calculating the apparatus parameter waveform index from the apparatus condition information of the target manufacturing apparatus, which is acquired by a target apparatus parameter acquisition unit connected to the target manufacturing apparatus. When the target apparatus parameter index extracted as the cause of the failure indicates an abnormal value, the corresponding real time monitor unit informs an operator that a failure extracted from the abnormal parameter extraction unit 48 exists in the target manufacturing apparatus. As a result, the maintenance of the target manufacturing apparatus is immediately executed. Thus, damage caused by the failure can be minimized.

As described above, in the manufacturing apparatus control system according to the first embodiment, by implementing indexation of an apparatus parameter waveform and evaluating a significant difference of a frequency distribution of an apparatus parameter waveform index on the basis of the presence or absence of a specific failure pattern, it is possible to identify an apparatus parameter and a corresponding manufacturing apparatus for the cause of a failure pattern occurrence. Moreover, by monitoring a manufacturing apparatus referring to an apparatus parameter waveform index which is used for identifying a cause of a failure pattern occurrence, it is possible to construct a real time monitoring system for a specific failure pattern.

Figure 21:
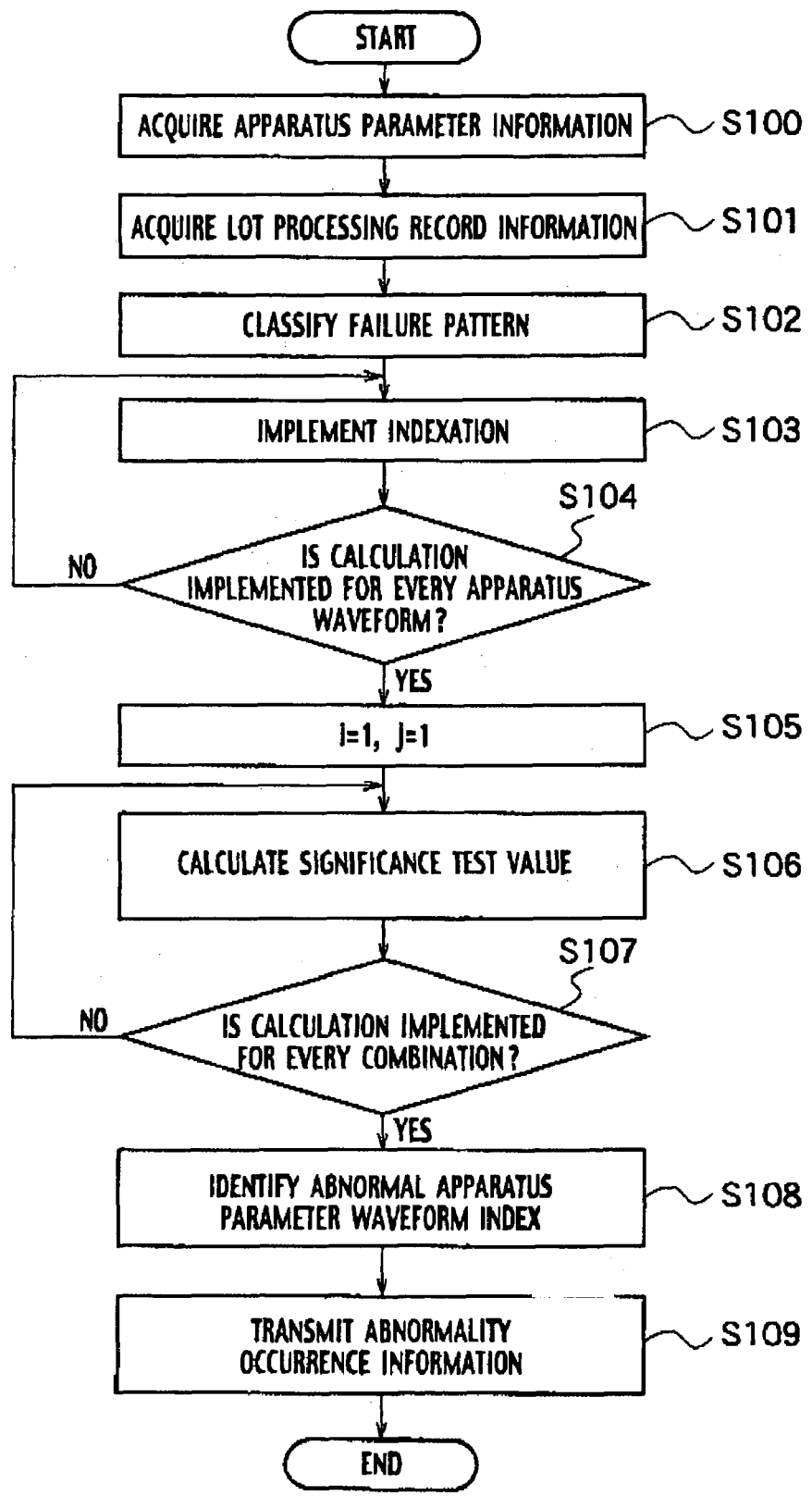
FIG. 21 is a flowchart showing an example of a method for controlling manufacturing apparatuses according to the first embodiment of the present invention.

A method for controlling manufacturing apparatuses according to the first embodiment of the present invention will be set forth with reference to the flowchart as shown in FIG. 21.

First, in a plurality of manufacturing apparatuses 2a, 2b, . . . , 2n which are control targets, a plurality of lots of wafers for manufacturing semiconductor devices are processed and produced by manufacturing facilities connected to a control system of a manufacturing apparatus shown in FIG. 1. Time series data of apparatus parameters respectively controlling the manufacturing apparatuses 2a, 2b, . . . , 2n which sequentially process a plurality of lots are acquired by the apparatus parameter acquisition units 4a, 4b, . . . , 4n, respectively. The time series data of the apparatus parameters acquired by the apparatus parameter acquisition units 4a, 4b, . . . , 4n are stored as apparatus parameter information in the apparatus parameter database 22 by the apparatus parameter collection server 8. The processing record information, such as product names and lot numbers processed in the manufacturing apparatuses 2a, 2b, . . . , 2n, together with the time information, is stored in the production control database 24 by the production control server 16.

After completing wafer processes, wafer tests including a variety of electrical tests in the manufacturing facilities are conducted using the tester 18 for a plurality of circuit blocks fabricated in each of the wafers. The tester server 20 controlling the tester 18 generates failure maps from results of the wafer tests to store the failure maps together with the lot numbers in the wafer test database 26.

In Step S100, the apparatus parameter information is acquired from the apparatus parameter database 22 of the apparatus parameter collection server 8 by the manufacturing information input unit 40 of the CPU 10 shown in FIG. 1. In addition, in Step S101, time series data of processing record information on each lot are acquired from the production control database 24 of the production control server 16 by the manufacturing information input unit 40.

In Step S102, failure maps stored in the wafer test database 26 of the test server 20 are acquired by the failure pattern classification module 42. The failure pattern classification module 42 classifies each failure map into each failure pattern based on a tendency of an in-plane distribution of failures on a wafer. The classified failure maps are stored in the failure pattern classification database 28.

In Step S103, the time series data of the apparatus parameters are statistically processed by the index calculation unit 44 using a plurality of indexation algorithms on the basis of lot sequence periods processed in the manufacturing apparatuses 2a, 2b, . . . , 2n, respectively, to calculate a plurality of apparatus parameter waveform indices corresponding to each of the indexation algorithms. In Step S104, the calculation of the apparatus parameter waveform indices in Step S103 is repeated until the apparatus parameter waveform indices are calculated for all the target apparatus parameter time series data. The calculated apparatus parameter waveform indices are stored in the index database 30.

For calculating significance test values Pij for all the combinations of each apparatus waveform index having an apparatus waveform index number [i] and each failure pattern having a failure pattern classification number [j], in Step S105, the apparatus waveform index number [i] and the failure pattern classification number [j] both are set to 1. In Step S106, first and second frequency distributions with and without the failure pattern of classification number [1] are evaluated for the apparatus waveform index of number [1] by the index analysis unit 46. The index analysis unit 46 implements a significance test between the first and second frequency distributions to calculate a significance test value P11. In Step S107, the calculation of the significance test value in Step S106 is repeated until all the significance test values Pij are calculated for the combinations of each apparatus waveform index of number [i] and each failure pattern of classification number [j].

In Step S108, each of the significance test values Pij is compared with a test reference value for searching an abnormal apparatus parameter waveform index by the abnormal parameter extraction unit 48. As a result, a target apparatus parameter is identified, in which abnormality occurs that is a cause of failure pattern occurrence. Additionally, the abnormal parameter extraction unit 48 stores conditions of abnormality occurrence of an apparatus parameter and abnormality occurrence information in the real time monitor database 32a. Furthermore, in Step S109, the abnormal parameter extraction unit 48 transmits abnormal occurrence information to the corresponding real time monitor unit.

In a method for controlling a manufacturing apparatus according to the first embodiment, apparatus parameter waveform indices calculated from apparatus condition information acquired in the apparatus parameter acquisition units 4a, 4b, . . . , 4n of the corresponding manufacturing apparatuses 2a, 2b, . . . , 2n are continuously monitored in the corresponding real time monitor units 6a, 6b, . . . , 6n, on the basis of abnormality occurrence information received from the abnormal parameter extraction unit 48. When an abnormality is detected in the monitored apparatus parameter waveform index, the corresponding real time monitor units 6a, 6b, . . . , 6n inform an operator that an abnormality of the corresponding manufacturing apparatuses 2a, 2b, . . . , 2n has occurred, which corresponds to a failure pattern occurrence extracted by the abnormal parameter extraction unit 48. By information from the real time monitor units 6a, 6b, . . . , 6n, maintenance of the corresponding manufacturing apparatuses 2a, 2b, . . . , 2n is immediately executed. Thus, it is possible to minimize damage caused by the failure.

(Second Embodiment)

Figure 22:
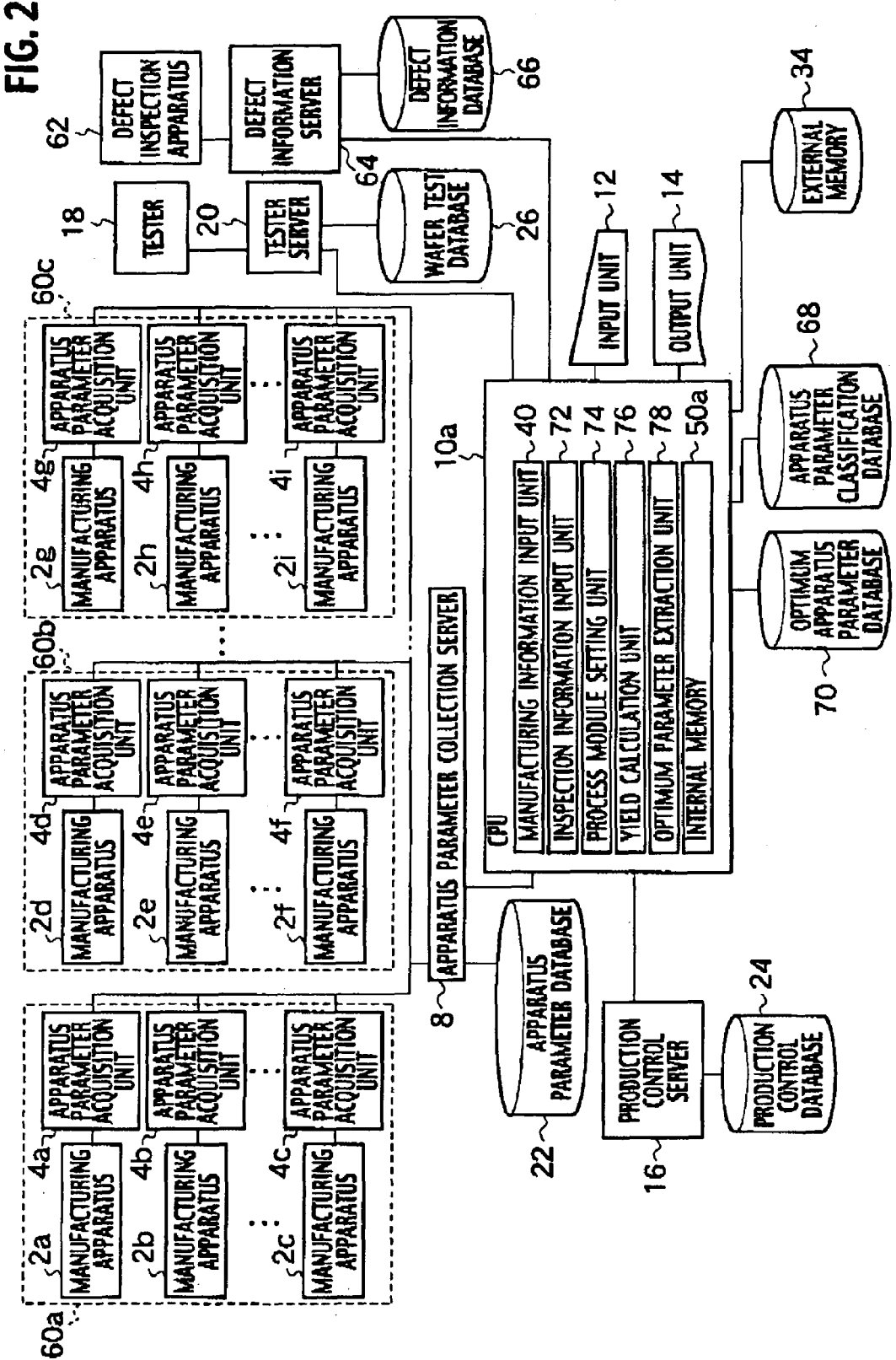
FIG. 22 is a block diagram showing an example of a configuration of a control system of manufacturing apparatuses according to a second embodiment of the present invention.

A control system of a manufacturing apparatus according to a second embodiment of the present invention includes an apparatus parameter database 22, a production control database 24, a wafer test database 26, a CPU 10a, and the like, as shown in FIG. 22. The apparatus parameter database 22 is installed in an apparatus parameter collection server 8. The production control database 24 is installed in a production control server 16. The wafer test database 26 is installed in a tester server 20. A defect information database 66 is installed in a defect information server 64. The apparatus parameter collection server 8, the production control server 16, the tester server 20, and a defect information server 64 are connected to the CPU 10a. In addition, an input unit 12, an output unit 14, an apparatus parameter classification database 68, an optimum apparatus parameter database 70, and an external memory 34 are connected to the CPU 10a. Furthermore, the CPU 10a includes a manufacturing information input unit 40, an inspection information input unit 72, a process module setting unit 74, a yield calculation unit 76, an optimum parameter extraction unit 78, an internal memory 50a, and the like.

Manufacturing facilities for a semiconductor device include a plurality of process modules 60a, 60b, . . . , 60c. In the process module 60a, a plurality of manufacturing apparatuses 2a, 2b, . . . , 2c are provided. Similarly, in the process module 60b, . . . , 60c a plurality of manufacturing apparatuses 2d, 2e, . . . , 2f, . . ., and a plurality of manufacturing apparatuses 2g, 2h, . . . , 2i, are provided. Apparatus parameter acquisition units 4a, 4b, . . . , 4c, 4d, 4e, 4f, 4g, 4h, . . . , 4i which attach to the respective manufacturing apparatuses 2a, 2b, . . . , 2c, 2d, 2e, . . . , 2f, 2g, 2h, . . . , 2i, are connected to the apparatus parameter collection server 8. The process modules 60a, 60b, . . . , 60c are provided with an active layer process module, a gate process module, a first layer wiring process module, and the like, which combine a plurality of continuous element process groups executed in an active layer process, a gate process, a first layer wiring process, and the like.

A tester 18 is connected to the tester server 20. A defect inspection apparatus 62 is connected to the defect information server 64. The tester 18 and the defect inspection apparatus 62 execute electrical tests and defect inspections of a circuit pattern and a test element group (TEG) of a semiconductor device on a processed wafer whenever each lot processing in the process modules 60a, 60b, . . . , 60c is completed. The tester server 20 and the defect information server 64 store results of the electrical tests and the defection inspections of the tester 18 and the defect inspection apparatus 62 together with lot information, into the wafer test database 26 and the defect information database 66, as wafer test information and defect information for the respective process modules 60a, 60b, . . . , 60c.

The control system of a manufacturing apparatus according to the second embodiment is different from the first embodiment in which the CPU 10a controls the manufacturing apparatuses 2a, 2b, . . . , 2c, 2d, 2e, . . . , 2f, 2g, 2h, . . . , 2i installed in the respective process modules 60a, 60b, . . . , 60c using the wafer test information and the defect information for the respective process modules 60a,

60b, ..., 60c. Other configurations are similar as in the first embodiment, so duplicated descriptions are omitted.

The manufacturing information input unit 40 of the CPU 10a acquires apparatus parameter information including apparatus parameter set values of a plurality of apparatus parameters from the apparatus parameter database 22 of the apparatus parameter collection server 8. The apparatus parameters control the manufacturing apparatuses 2a, 2b, ..., 2c, 2d, 2e, ..., 2f, 2g, 2h, ..., 2i which are installed in the respective process modules 60a, 60b, ..., 60c of the manufacturing facilities. Additionally, the manufacturing information input unit 40 acquires lot processing record information processed in the respective process modules 60a, 60b, ..., 60c from the production control database 24 of the production control server 16.

The inspection information input unit 72 acquires the wafer test information and the defect information for the respective process modules 60a, 60b, ..., 60c, from the wafer test database 26 of the tester server 20 and the defect information database 66 of the defect information server 64.

The process module setting unit 74 selects a target process module from among the plurality of process modules 60a, 60b, ..., 60c. Assuming that the active layer process module is selected as the target process module, the process nodule setting unit 74 extracts all the manufacturing apparatuses included in the active layer process module. Moreover, the process module setting unit 74 tabulates a plurality of apparatus parameter set values of the manufacturing apparatuses in the extracted active layer process module for each of the lots, based on the lot processing record information acquired by the manufacturing information input unit 40, as shown in FIG. 23. The table of the apparatus parameter set values is stored in the apparatus parameter classification database 68, as apparatus parameter set value information.

The yield calculation unit 76 calculates a process yield of the target process module on the basis of the wafer test information and the defect information acquired by the inspection information input unit 72. The calculated result of the process yield of the target process module is tabulated for every lot on the basis of the lot processing record information, as shown in FIG. 24.

The optimum parameter extraction unit 78 extracts an apparatus parameter having a significant difference with regard to the process yield of the target process module by a statistical method, on the basis of the apparatus parameter set value information acquired from the apparatus parameter classification database 68 and the process yield for each lot calculated by the yield calculation unit 76. As the statistical method for extracting an apparatus parameter, data mining may be used. Additionally, as the statistical method for extracting an apparatus parameter, multivariate analysis may also be used. Furthermore, the optimum parameter extraction unit 78 provides combinations of an apparatus parameter number and an apparatus parameter set value which provide the maximum process yield in the target process module, from the extracted apparatus parameters, as shown in FIG. 25. The extracted combinations are stored in the optimum apparatus parameter database 70 as optimum apparatus parameter set values.

As described above, in the control system of a manufacturing apparatus according to the second embodiment, by extracting apparatus parameter set values correlated with process yield of the target process module from the apparatus parameters of all the manufacturing apparatuses included in the target process module, by a statistical method, combinations of the apparatus parameter number and the optimum apparatus parameter set value which provide the maximum process yield in the target process module can be determined. Moreover, by setting and maintaining the apparatus parameters of the corresponding manufacturing apparatus to the extracted optimum apparatus parameter set values, it is possible to achieve operation requirements of a manufacturing apparatus providing high process yield in a target process module.

Figure 26:
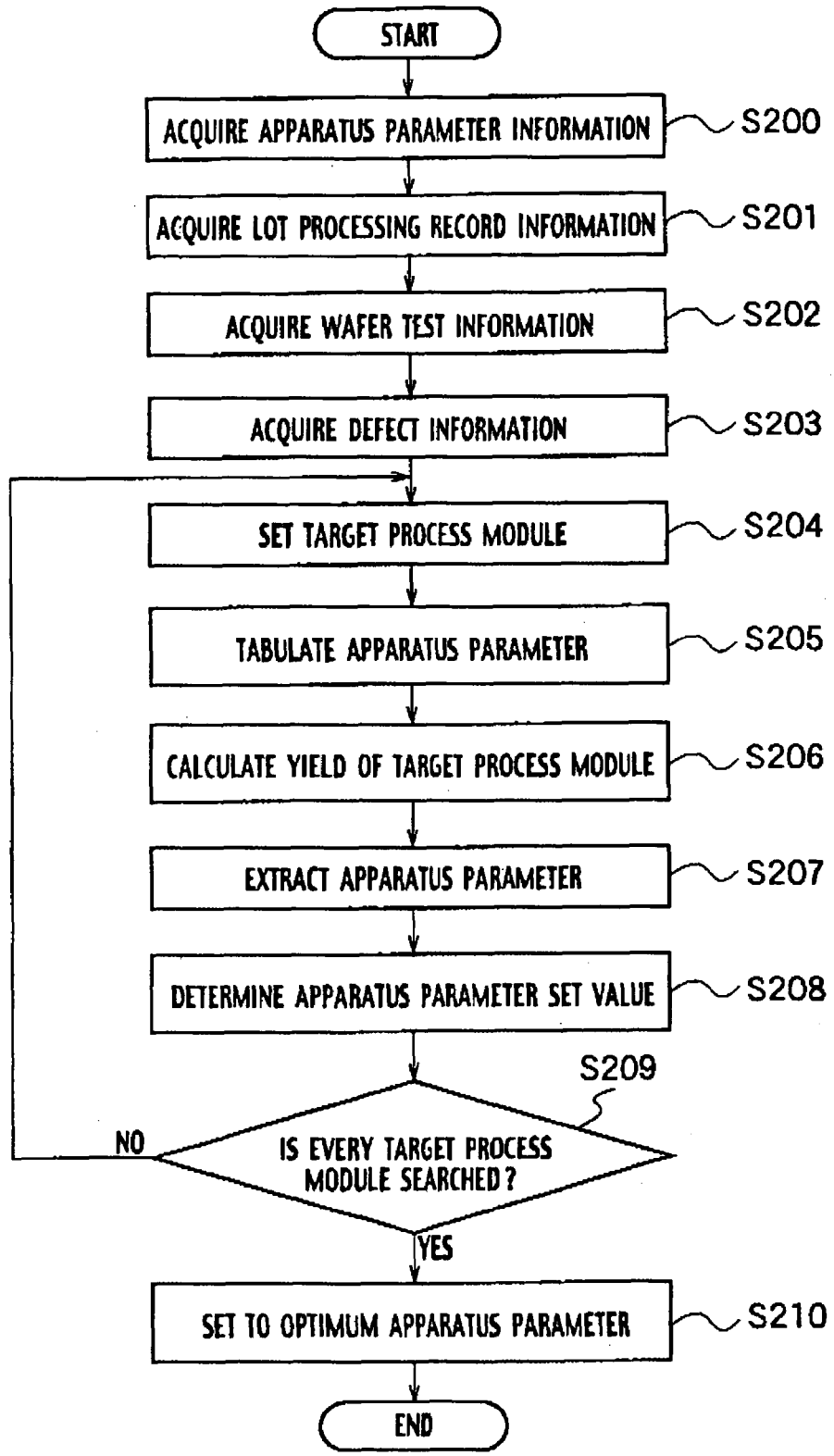
FIG. 26 is a flowchart showing an example of a method for controlling manufacturing apparatuses according to the second embodiment of the present invention.

A method for controlling manufacturing apparatuses according to the second embodiment of the present invention will be described with reference to a flowchart shown in FIG. 26.

In a plurality of manufacturing apparatuses. 2a, 2b, ..., 2c, 2d, 2e, ..., 2f, 2g, 2h, ..., 2i which are the targets for controlling a manufacturing apparatus, a plurality of wafers for semiconductor devices are processed and produced on a lot basis in a plurality of process modules 60a, 60b, ..., 60c connected to a control system of a manufacturing apparatus as shown in FIG. 22. Apparatus parameter set values which control the respective manufacturing apparatuses 2a, 2b, ..., 2c, 2d, 2e, ..., 2f, 2g, 2h, ..., 2i sequentially processing a plurality of lots are acquired by apparatus parameter acquisition units 4a, 4b, ..., 4c, 4d, 4e, 4f, 4g, 4h, ..., 4i, respectively. The apparatus parameter set values acquired by the apparatus parameter acquisition units 4a, 4b, ..., 4c, 4d, 4e, ..., 4f, 4g, 4h, ..., 4i are stored as apparatus parameter information in the apparatus parameter database 22 by the apparatus collection server 8. The lot processing record information of each lot processed in the respective process modules 60a, 60b, ..., 60c is stored in the production control database 24 by the production control server 16.

Upon completion of wafer processes of the lot in the respective process modules 60a, 60b, ..., 60c, electrical tests and defect inspections of a circuit pattern and a test element group (TEG) representing an intermediate state of a target semiconductor device on a processed wafer are executed using the tester 18 and the defect inspection apparatus 62. The tester server 20 and the defect information server 64 store results of the electrical tests and the defect inspections by the tester 18 and the defect information server 62 together with the lot information in the wafer test database 26 and the defect information database 66, respectively, as the wafer test information and the defect information regarding the respective process modules 60a, 60b, ..., 60c.

In Step S200, the plurality of apparatus parameter set values which respectively control the plurality of manufacturing apparatuses 2a, 2b, ..., 2c, 2d, 2e, ..., 2f, 2g, 2h, ..., 2i are acquired from the apparatus parameter database 22 of the apparatus parameter collection server 8 by the manufacturing information input unit 40 of the CPU 10a shown in FIG. 22. In Step S201, the lot processing record information processed in the respective process modules 60a, 60b, ..., 60c is acquired from the production control database 24 of the production control server 16 by the manufacturing information input unit 40.

In Step S202, the wafer test information stored in the wafer test database 26 of the tester server 20 is acquired together with the lot information by the inspection information input unit 72. In Step S203, the defect information stored in the defect information database 66 of the defect information server 64 is acquired together with the lot information by the inspection information input unit 72.

In Step S204, all manufacturing apparatuses included in a target process module, which are selected from among the plurality of process modules 60a, 60b, ..., 60c are extracted by the process module setting unit 74. Additionally, in Step S205, the plurality of apparatus parameter set values for the respective manufacturing apparatuses of the extracted target process modules ale tabulated for every lot on the basis of the lot processing record information acquired by the manufacturing information input unit 40. The tabulated apparatus parameter set values are stored in the apparatus parameter classification database 68 as the apparatus parameter set value information, by the process module setting unit 74.

In Step S206, the process yield of the target process module is calculated by the yield calculation unit 76, on the basis of the wafer test information and the defect information acquired by the inspection information input unit 72.

In Step S207, the apparatus parameter having a significant difference with regard to the process yield of the target process module is extracted by the optimum parameter extraction unit 78 using a statistical method on the basis of the apparatus parameter set value information acquired from the apparatus parameter classification database 68 and the process yield for each lot basis calculated by the yield calculation unit 76. Further, in Step S208, a combination of an apparatus parameter number and an apparatus parameter set value, which provides the maximum process yield in the target process module, is determined from the apparatus parameters extracted by the optimum parameter extraction unit 78, and then stored in the optimum apparatus parameter database 70 as the optimum parameter set value.

In Step S209, processing from Step S204 to Step 5208 is repeated until the optimum apparatus parameter set values are extracted for all the target process modules. After the completion of the processing, in Step S210, the optimum apparatus parameter set values extracted by the optimum parameter extraction unit 78 are transferred to the corresponding manufacturing apparatuses of the respective process modules 60a, 60b, . . . , 60c. Thus, the optimum apparatus parameter set values are set to the manufacturing apparatuses 2a, 2b, . . . , 2c, 2d, 2e, . . . , 2f, 2g, 2h, . . . , 2i.

In the manufacturing apparatus control method according to the second embodiment, the apparatus parameter set values that correlate with the process yields of the target process modules by a statistical method from the apparatus parameters of all the manufacturing apparatuses included in the target process modules, the combinations of the apparatus parameter numbers and the optimum apparatus parameter set values are extracted. This process provides the maximum process yields in the target process modules, can be determined. Moreover, by setting and maintaining the apparatus parameters of the corresponding manufacturing apparatuses to the extracted optimum apparatus parameter set values, it is possible to achieve operation requirements of the manufacturing apparatuses so as to provides high process yield in the target process modules.

Other Embodiments

In the first and second embodiments of the present invention, each process is executed by batch processing. Thus, the manufacturing apparatuses are controlled using the processing record information, the wafer test information, and the defect information, which are provided by lots including a plurality of wafers. However, when each process is executed by single wafer processing, the manufacturing apparatuses may be controlled by determining the apparatus parameter waveform indices or the optimum apparatus parameter set values for each wafer using processing record information, wafer test information, and defect information, which are provided by each wafer.

Various modifications will become possible for those skilled in the art after storing the teachings of the present disclosure without departing from the scope thereof.

What is claimed is:

1. A system for monitoring manufacturing apparatuses, comprising:
a manufacturing information input unit configured to acquire time series data of apparatus parameters controlling a plurality of manufacturing apparatuses, the manufacturing apparatuses performing a sequence of manufacturing processes on wafers so as to manufacture semiconductor devices;
a failure pattern classification unit configured to classify in-plane distributions of failures in each of the wafers into failure patterns;
an index calculation unit configured to statistically process the time series data by a plurality of algorithms so as to calculate a plurality of indices corresponding to the respective algorithms;
an index analysis unit configured to provide first and second frequency distributions of the indices and to implement a significance test between the first and second frequency distributions, the first and second frequency distributions being categorized with and without a target failure pattern, respectively;
an abnormal parameter extraction unit configured to extract a failure cause index of the target failure pattern by comparing a value of the significance test with a test reference value; and
a plurality of real-time monitor units configured to monitor operation of the manufacturing apparatuses by referring to the failure cause index.

2. The system of claim 1, further comprising an apparatus parameter collection server configured to collect the apparatus parameters from apparatus parameter acquisition units connected to the manufacturing apparatuses.

3. A system for monitoring manufacturing apparatuses, comprising:
a manufacturing information input unit configured to acquire time series data of apparatus parameters controlling a plurality of manufacturing apparatuses, the manufacturing apparatuses performing a sequence of manufacturing processes on wafers so as to manufacture semiconductor devices;
a failure pattern classification unit configured to classify in-plane distributions of failures in each of the wafers into failure patterns;
an index calculation unit configured to statistically process the time series data by a plurality of algorithms so as to calculate a plurality of indices corresponding to the respect algorithms;
an index analysis unit configured to provide first and second frequency distributions of the indices and to implement a significance test between the first and second frequency distributions, the first and second frequency distributions being categorized with and without a target failure pattern, respectively;
an abnormal parameter extraction unit configured to extract a failure cause index of the target failure pattern by comparing a value of the significance test with a test reference value;
a plurality of real-time monitor units configured to monitor operation of the manufacturing apparatuses by referring to the failure cause index; and
a tester server configured to generate failure maps displaying the in-plane distributions based on failures measured by electrical tests of the semiconductor devices, which are performed after a sequence of wafer processes has been completed.

4. The system of claim 3, wherein the indices include an autocorrelation coefficient of the time series data, a concordance rate of increase and decrease in variations of the time series data, a primary fitting coefficient that is a gradient of a variation of the time series data, a correlation coefficient indicating a difference between target time series data and last time series data, and another correlation coefficient indicating a difference between the target time series data and prior time series data.

5. The system of claim 3, wherein the failure patterns are distributions of unevenly distributed clustering failures.

6. A method for monitoring manufacturing apparatuses, comprising:
    acquiring time series data of apparatus parameters controlling a plurality of manufacturing apparatuses;
    classifying in-plane distributions of failures of wafers into failure patterns, the wafers processed by the manufacturing apparatuses;
    statistically processing the time series data by a plurality of algorithms so as to calculate a plurality of indices corresponding to the respective algorithms; providing first and second frequency distributions of the indices and implementing a significance test between the first and second frequency distributions, the first and second frequency distributions being categorized with and without a target failure pattern, respectively;
    identifying a failure cause index of the target failure pattern by comparing a value of the significance test with a test reference value; and
    monitoring operation of the manufacturing apparatuses by referring to the failure cause index.

7. The method of claim 6, wherein the indices are calculated from waveforms of the time series data.

8. The method of claim 6, wherein the indices include an autocorrelation coefficient of the time series data, a concordance rate of increase and decrease in variations of the time series data, a primary fitting coefficient that is a gradient of a variation of the time series data, a correlation coefficient indicating a difference between target time series data and last time series data, and another correlation coefficient indicating a difference between the target time series data and prior time series data.

9. The method of claim 6, wherein the failure patterns are distributions of unevenly distributed clustering failures.

* * * * *